(12) United States Patent
Sakai

(10) Patent No.: US 6,974,916 B2
(45) Date of Patent: Dec. 13, 2005

(54) LAMINATED CERAMIC ELECTRONIC COMPONENT HAVING VIA-HOLE CONDUCTORS WITH DIFFERENT SECTIONAL SIZES

(75) Inventor: Norio Sakai, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 232 days.

(21) Appl. No.: 09/836,081

(22) Filed: Apr. 17, 2001

(65) Prior Publication Data

US 2003/0030985 A1 Feb. 13, 2003

(30) Foreign Application Priority Data

May 22, 2000 (JP) .................................. 2000-149327

(51) Int. Cl.⁷ ................................................. H05K 1/11
(52) U.S. Cl. ..................... 174/262; 174/263; 174/264; 174/265; 361/793; 361/795
(58) Field of Search ................. 174/262–266; 361/792–795

(56) References Cited

U.S. PATENT DOCUMENTS

| | | | | |
|---|---|---|---|---|
| 3,726,002 A | * | 4/1973 | Greenstein et al. ........... 29/832 |
| 3,922,479 A | * | 11/1975 | Older et al. ................. 174/264 |
| 4,739,448 A | * | 4/1988 | Rowe et al. ................. 361/719 |
| 5,061,824 A | * | 10/1991 | Alexander et al. .......... 174/250 |
| 5,375,042 A | | 12/1994 | Arima et al. |
| 5,408,053 A | * | 4/1995 | Young ........................ 174/264 |
| 5,451,721 A | * | 9/1995 | Tsukada et al. ............. 174/261 |
| 5,627,406 A | | 5/1997 | Pace |
| 5,719,749 A | | 2/1998 | Stopperan |
| 6,118,671 A | * | 9/2000 | Tanei et al. ................. 361/795 |
| 6,320,140 B1 | * | 11/2001 | Enomoto ..................... 174/264 |
| 6,329,610 B1 | * | 12/2001 | Takubo et al. .............. 174/264 |

FOREIGN PATENT DOCUMENTS

| | | |
|---|---|---|
| JP | 61-148847 | 7/1986 |
| JP | 02-137295 | 5/1990 |
| JP | 02-148889 | 6/1990 |
| JP | 06-268369 | 9/1994 |
| JP | 08-023168 | 1/1996 |

* cited by examiner

*Primary Examiner*—Evan Pert
*Assistant Examiner*—Jose H. Alcala
(74) *Attorney, Agent, or Firm*—Keating & Bennett, LLP

(57) ABSTRACT

In a laminated ceramic electronic component, the sectional size of via-hole conductors extending through thicker ceramic layers is larger than that of via-hole conductors extending through thinner ceramic layers. This makes it possible to facilitate filling of a conductive paste for the via-hole conductors having a larger height and to inhibit a conductive paste for the via-hole conductors having a smaller height from being lost after filling.

10 Claims, 4 Drawing Sheets

LAMINATED CERAMIC ELECTRONIC COMPONENT HAVING VIA-HOLE CONDUCTORS WITH DIFFERENT SECTIONAL SIZES

BACKGROUND OF THE INVENTION

1. Field of the Invention

The present invention relates to a laminated ceramic electronic component and a production method therefor, and to an electronic device having such a laminated ceramic electronic component. More particularly, the present invention relates to an improvement in the size of via-hole conductors formed in a laminated ceramic electronic component.

2. Description of the Related Art

A laminated ceramic electronic component, which is related to the present invention, is also called a "multilayer ceramic substrate", and includes a laminated member having a laminated structure including a plurality of ceramic layers.

Wiring conductors are provided for specific ceramic layers disposed in the laminated member, thereby constituting a desired circuit. Wiring conductors include, for example, a via-hole conductor extending through the specific ceramic layers or a conductor film extending along the principal surface of the ceramic layers. The conductor film includes an inner conductor film disposed inside the laminated member and an outer conductor film disposed on the outer surface of the laminated member.

Passive elements, such as capacitors, inductors, triplate structures, and/or microstrip lines, are sometimes built in the laminated member. A part of the via-hole conductor and a part of the inner conductor film are used to constitute such passive elements. Active elements, such as semiconductor IC chips, and, as necessary, some of the passive elements, are sometimes mounted outside the laminated member. Part of the above-described outer conductor film functions as a terminal for electrically connecting such mounted elements.

The laminated ceramic electronic component combined as described above is mounted on an appropriate wiring board so as to constitute a desired electronic device. When the laminated ceramic electronic component is mounted on the wiring board, a part of the above-described outer conductor film functions as a terminal for electrically connecting the laminated ceramic electronic component to the wiring board.

For example, such a laminated ceramic electronic component is used as an LCR high-frequency composite component in the field of mobile communication terminals, and is used as a hybrid component, which is a combination of an active element, such as a semiconductor IC chip, and a passive element, such as a capacitor, an inductor, and a resistor, or is simply used as a semiconductor IC package in the computer field.

More specifically, the laminated ceramic electronic component is widely used to constitute various electronic components, such as PA module boards, RF diode switches, filters, chip antennas, package components, and hybrid devices.

In order to meet the growing demand for higher frequency, the ceramic layers in such a laminated ceramic electronic component are made of dielectric materials having low dielectric constants in most cases. Furthermore, in order to facilitate co-firing for obtaining a laminated member, it is preferable that the ceramic layers be made of ceramics having the same dielectric constant, that is, having the same composition.

With such a background, when a passive element is built in the laminated member, as described above, the thickness of the ceramic layer is changed in accordance with the type of the passive element. This will be described with reference to FIGS. 4 to 6.

FIG. 4 is a cross-sectional view illustrating a capacitor 1 defining a built-in element. The capacitor 1 includes a plurality of capacitor electrodes 3 defined by inner conductor films and opposing one another with ceramic layers 2 therebetween. In order for such a capacitor 1 to be compact and to have a large capacitance, thicknesses T1 and T2 of the ceramic layers 2 are decreased.

FIG. 5 is a cross-sectional view illustrating a triplate structure 4 defining a built-in element. The triplate structure 4 includes a center conductor 5 defined by an inner conductor film, and a pair of ground conductors 7 and 8 similarly defined by inner conductor films and placed on both sides of the center conductor 5 with ceramic layers 6 therebetween. In such a triplate structure 4, the thicknesses of the ceramic layers 6 are increased in order to increase a distance S between the ground conductors 7 and 8.

FIG. 6 is a cross-sectional view illustrating two capacitors 9 and 10 defining built-in elements. In order to prevent coupling between the electrostatic capacitances of the two capacitors 9 and 10, a thickness T of a ceramic layer 11 interposed between the capacitors 9 and 10 is increased.

In such a case in which a built-in element is placed inside the laminated member, the optimal thickness of the ceramic layer positioned in relation to the built-in element varies depending on the type of the built-in element. For this reason, it is necessary to mix a plurality of types of ceramic layers of different thicknesses in the laminated member.

On the other hand, a plurality of via-hole conductors extending through a specific ceramic layer in the laminated member generally have the same sectional size. This is because efficiency of manufacturing is decreased when a plurality of via-hole conductors of different sectional sizes are formed.

For example, a method shown in FIG. 7 is adopted to form via-hole conductors.

Referring to FIG. 7, through holes 13 are formed in a ceramic green sheet 12, which will become a ceramic layer, in a laminated member of a laminated ceramic electronic component. The ceramic green sheet 12 is placed on a suction device 14.

The suction device 14 has a vacuum chamber 15. Negative pressure is applied in the vacuum chamber 15, as shown by arrow 16. The opening of the vacuum chamber 15 is closed by a suction plate 17 having multiple minute air paths (not shown).

A porous sheet 18 formed of paper or another filter material is placed on the upper surface of the suction plate 17. The ceramic green sheet 12 is arranged to contact with the porous sheet 18.

When negative pressure is applied in the vacuum chamber 15 in such a state, as shown by the arrow 16, it is also exerted on the through holes 13 via the suction plate 17 and the porous sheet 18.

In this state, a conductive paste 19 is filled into the through holes 13 by using screen printing. That is, the conductive paste 19 is applied on a screen 20, is moved with the movement of a squeegee 21 along the screen 20, and is filled in the through holes 13 during the movement by the action of the above-described negative pressure. The conductive paste 19 in the through holes 13 forms via-hole conductors 22.

Next, the ceramic green sheet 12 is peeled off the porous sheet 18. Before or after peeling, the conductive paste 19 for the via-hole conductors 22 is dried.

In the above-described peeling step, however, a part of the conductive paste 19, which is filled in the through holes 13 so as to form the via-hole conductors 22, adheres to the porous sheet 18, as shown in FIG. 8, and therefore, the amount of the conductive paste 19 in the through holes 13 is insufficient. Such insufficient filling resulting from the loss of the conductive paste 19 after filling causes defective continuity between the via-hole conductor 22 and another via-hole conductor or another wiring conductor such as a conductor film.

A method shown in FIG. 9 may be used to form the via-hole conductors 22. In FIG. 9, the components corresponding to the components shown in FIG. 7 are denoted by like numerals, and repetitive description thereof is omitted.

Referring to FIG. 9, a ceramic green sheet 12 is handled while being backed with a carrier film 23. Through holes 13 are formed through the ceramic green sheet 12 and the carrier film 23.

In a manner similar to that shown in FIG. 7, a porous sheet 18 is placed on the upper surface of a suction plate 17 of a suction device 14. The ceramic green sheet 12 backed with the carrier film 23 is arranged in contact with the porous sheet 18 so that the carrier film 23 is positioned on the upper side of the ceramic green sheet 12.

In such a state, negative pressure is applied in a vacuum chamber 15, as shown by arrow 16. The negative pressure is also exerted into the through holes 13 via the suction plate 17 and the porous sheet 18, and a conductive paste 19 is applied on the upper surface of the carrier film 23. The conductive paste 19 is moved with the movement of a squeegee 24 along the upper surface of the carrier film 23, and is filled into the through holes 13 during the movement by the action of the above-described negative pressure.

By thus filling the conductive paste 19 in the through holes 13 from the side of the carrier film 23 which functions as a mask without using the screen 20 shown in FIG. 7, via-hole conductors 22 are formed in the through holes 13.

In a case in which the above method shown in FIG. 9 is adopted, a conductive paste film functioning as a conductor film is formed by printing a conductive paste on the principal surface of the ceramic green sheet 12 which faces outward, while the ceramic green sheet 12 is backed with the carrier film 23.

The ceramic green sheet 12 is thus handled while being backed with the carrier film 23 because it is weak and is quite difficult to handle alone. By handling the ceramic green sheet 12 while being backed with the carrier film 23, it is possible to facilitate handling and positioning of the ceramic green sheet 12 in each step. Moreover, it is possible to reduce variations in degrees of shrinkage of the ceramic green sheet 12 when the conductive paste 19 for forming the via-hole conductors 22 and the conductive paste film is dried.

When obtaining a laminated member for a desired laminated ceramic electronic component, a plurality of ceramic green sheets including the ceramic green sheet 12 are stacked. Before stacking, the carrier film 23 must be peeled off the ceramic green sheet 12. In this case, a part of the conductive paste 19 filled in the through hole 13 is sometimes removed together with the carrier film 23, and the amount of the conductive paste 19 in the through holes 13 becomes insufficient.

In the method shown in FIG. 9, of course, when the ceramic green sheet 12 is peeled off the porous sheet 18, a part of the conductive paste 19 filled in the through holes 13 is also sometimes removed and adheres to the porous sheet 18, as shown in FIG. 8.

Insufficient filling of the conductive paste 19 in the through hole 13 occurs not only due to the causes described with reference to FIG. 8 or FIG. 10, but also in the following cases.

For example, in a case in which the ceramic green sheet 12 is relatively thin, the shape-maintaining strength of the conductive paste 19 filled in the through holes 13 is relatively low. For this reason, at least a part of the conductive paste 19 sometimes falls out when handling the ceramic green sheet 12.

After the via-hole conductors 22 are formed, a conductive paste film functioning as a conductor film is sometimes formed on the ceramic green sheet 12 by screen printing. In this case, an emulsion film is formed on a surface of a screen used in screen printing, which surface opposes the ceramic green sheet 12. When the screen is pressed by a squeegee, the emulsion film moves into contact with the ceramic green sheet 12 and then moves apart therefrom along the shape of the leading end of the squeegee. As the result of such a movement of the emulsion film, a part of the conductive paste 19 filled in the through holes 13 sometimes adheres to the emulsion film and is removed to the side of the screen.

In order to form dense via-hole conductors 22 with high electrical conductivity, the conductive paste 19 used to form the via-hole conductors 22 has a higher content of metal components than that of the conductive paste for a conductor film. For this reason, the amount of resin components contained in the conductive paste 19 is relatively small, and as a result, the shape-maintaining strength of the conductive paste 19 is decreased. Because of this, the above-described insufficient filling of the conductive paste 19 in the through holes 13 is more likely to occur due to the loss after filling.

As described above, insufficient filling is more likely to occur due to the removal of a part of the conductive paste 19 filled in the through holes 13 as the sectional size of the through holes 13 increases and the height thereof decreases. Therefore, it is conceivable to decrease the sectional size of the through holes 13 and to increase the height thereof in order to prevent the conductive paste 19 filled in the through holes 13 from being removed. However, such measures to decrease the sectional size of the through holes 13 and to increase the height thereof cannot be adopted simply.

That is, for example, in a case in which the conductive paste 19 is applied by screen printing, as shown in FIG. 7, when the sectional size of the through holes 13 is small, high accuracy is required to align the screen 20 and the ceramic green sheet 12, and the conductive paste 13 cannot easily enter the through holes 13. For this reason, insufficient filling of the conductive paste 19 occurs, and a long time is needed to fill the conductive paste 19. These problems are pronounced, in particular, when the thickness of the ceramic green sheet 12 is large, that is, when the height of the through holes 13 is large.

SUMMARY OF THE INVENTION

In order to overcome the problems described above, preferred embodiments of the present invention provide a laminated ceramic electronic component, a method of forming the same, and an electronic device including such a novel component, the component having a laminated member including a plurality of stacked ceramic layers with first and second ceramic layers having different thicknesses, and being constructed to eliminate the problem of insufficient filling of conductive paste for defining a via-hole conductor.

According to a preferred embodiment of the present invention, a laminated ceramic electronic component includes a laminated member having a plurality of stacked ceramic layers including a first ceramic layer and a second ceramic layer which is thinner than the first ceramic layer, wherein wiring conductors are provided for a specific ceramic layer of the ceramic layers and include a via-hole conductor extending through the specific ceramic layer and a conductor film extending along the principal surface of the specific ceramic layer, and wherein the via-hole conductor includes first and second via-hole conductors having different sectional sizes.

Since the first and second via-hole conductors are provided to have different sectional sizes, it is possible to determine the sectional sizes of the via-hole conductors in consideration of efficient filling of conductive paste into the through holes for forming the via-hole conductors and prevention of loss of the conductive paste after filling. This inhibits insufficient filling of the conductive paste and improves reliability of electrical conductivity.

In a case in which the conductive paste is lost after filling, as described above, a lost portion of the conductive paste may adhere to an undesirable portion and may cause short circuiting and faulty connection with a mounted component. However, since preferred embodiments of the present invention can prevent the conductive paste from being lost after filling, the above problems are eliminated.

In a case in which insufficient filling of the conductive paste for the via-hole conductors is prone to occur, it is necessary to closely examine the presence or absence of insufficient filling. However, since such insufficient filling is eliminated by preferred embodiments of the present invention, it is possible to omit or simplify the examination of sufficient filling.

Preferably, the first via-hole conductor extends through the first ceramic layer, the second via-hole conductor extends through the second ceramic layer, and the sectional size of the first via-hole conductor is larger than that of the second via-hole conductor.

More preferably, of all the via-hole conductors, the sectional size of the via-hole conductor extending through the thicker ceramic layer is larger than that of the via-hole conductor extending through the thinner ceramic layers.

In preferred embodiments of the present invention, by setting the sectional size of the first via-hole conductor extending through the first ceramic layer to be larger than that of the second via-hole conductor extending through the second ceramic layer which is thinner than the first ceramic layer, and more preferably, by setting the sectional size of the via-hole conductor extending through the thicker ceramic layer, among all the via-hole conductors, to be larger than that of the via-hole conductor extending through the thinner ceramic layer, the relationship between the height and radial length of the via-hole conductor can be easily determined so as to prevent the above-described insufficient filling of the conductive paste. This makes it possible to more reliably prevent insufficient filling of the conductive paste.

Preferably, a plurality of via-hole conductors extending through the same ceramic layer have substantially the same sectional size.

Preferably, the aspect ratio expressed by H/D is determined so as to be within the range of approximately 0.1 to approximately 3.0, wherein H and D represent the height and radial length of the via-hole conductor, respectively.

In this case, it is possible to more reliably prevent the above-described insufficient filling of the conductive paste. When the cross-section of the via-hole conductor is substantially circular, the radial length of the via-hole conductor refers to the diameter of the circle. When the cross section is substantially square, the radial length refers to the length of the sides of the square. When the cross section is substantially rectangular, the radial length refers to the length of the longer sides.

Preferably, the plurality of ceramic layers have substantially the same dielectric constant, that is, have the same composition.

According to preferred embodiments of the present invention, insufficient filling of the conductive paste is prevented from occurring by making a plurality of ceramic layers have different thicknesses and correspondingly making via-hole conductors have different sectional sizes, as described above. Therefore, by making a plurality of ceramic layers of dielectric materials having substantially the same dielectric constant, and, for example, decreasing the thickness of a specific one of the ceramic layers, for example, a capacitor provided in relation thereto can be easily made compact and is provided with a high electrostatic capacitance.

In this case, since there is no need to mix a plurality of ceramic layers having different dielectric constants, the materials of the ceramic layers can be selected easily, and the conditions of the firing step of obtaining a laminated member in the laminated ceramic electronic component can be managed easily.

According to another preferred embodiment of the present invention, there is provided a production method for a laminated ceramic electronic component including the steps of preparing a plurality of ceramic green sheets including a first ceramic green sheet and a second ceramic green sheet that is thinner than the first ceramic green sheet, forming through holes extending through at least the first and second ceramic green sheets, filling a conductive paste into the through holes so as to form via-hole conductors therein, obtaining a green laminated member by stacking the ceramic green sheets including the first and second ceramic green sheets, and firing the green laminated member, wherein the sectional size of a first through hole formed through the first ceramic green sheet is preferably larger than that of a second through hole formed through the second ceramic green sheet.

According to another preferred embodiment of the present invention, there is provided an electronic device including a laminated ceramic electronic component and a wiring board for mounting the laminated ceramic electronic component thereon, wherein the laminated ceramic electronic component includes a laminated member having a plurality of stacked ceramic layers including a first ceramic layer and a second ceramic layer which is thinner than the first ceramic layer, wherein wiring conductors are provided for a specific ceramic layer and include a via-hole conductor extending through the specific ceramic layer and a conductor film extending along the principal surface of the specific ceramic layer, and wherein the via-hole conductor includes first and second via-hole conductors having different sectional sizes.

In this case, high reliability of the laminated ceramic electronic component is also reflected in the electronic device, and the reliability of the electronic device is greatly improved.

Additional elements, characteristics, features and advantages of the present invention will become apparent from the following description of the preferred embodiments with reference to the attached drawings.

DETAILED DESCRIPTION OF PREFERRED EMBODIMENTS

Figure 1:
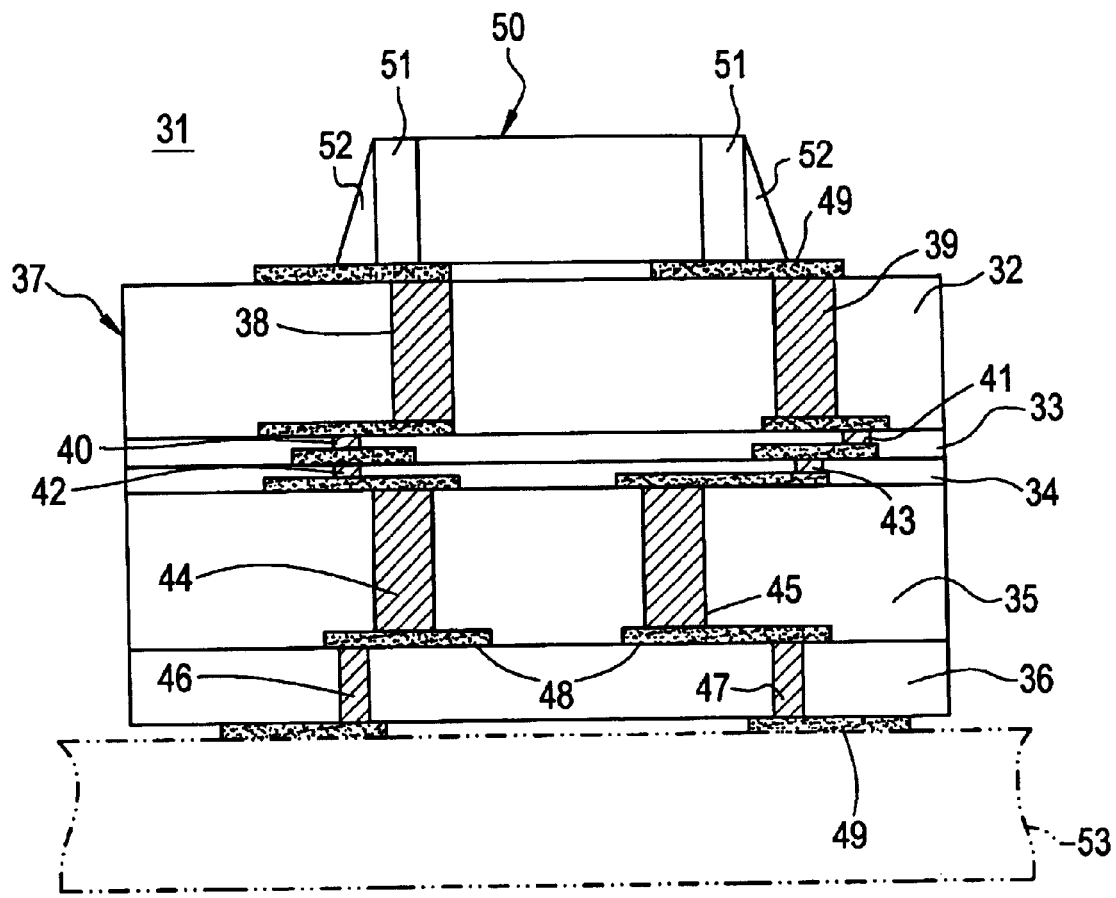
FIG. 1 is a cross-sectional view illustrating a laminated ceramic electronic component according to a preferred embodiment of the present invention.

FIG. 1 is a cross-sectional view illustrating a laminated ceramic electronic component 31 according to a preferred embodiment of the present invention.

The laminated ceramic electronic component 31 preferably includes a laminated member 37 having a plurality of stacked ceramic layers 32, 33, 34, 35, and 36. In the laminated member 37, the ceramic layers 32 to 36 are not the same in thickness. The thickness of the ceramic layers 32 and 35 is largest, the thickness of the ceramic layer 36 is medium, and the thickness of the ceramic layers 33 and 34 is smallest.

Various wiring conductors are provided specifically for the ceramic layers 32 to 36. Wiring conductors shown in the cross section in FIG. 1 are via-hole conductors 38 and 39 extending through the ceramic layer 32, via-hole conductors 40 and 41 extending through the ceramic layer 33, via-hole conductors 42 and 43 extending through the ceramic layer 34, via-hole conductors 44 and 45 extending through the ceramic layer 35, and via-hole conductors 46 and 47 extending through the ceramic layer 36.

Wiring conductors also include conductor films extending along the principal surfaces of the ceramic layers 32 to 36. The conductor films are some inner conductor films 48 disposed inside the laminated member 37, and some outer conductor films 49 disposed on the outer surfaces of the laminated member 37.

A chip-type electronic component 50, such as a chip capacitor, is mounted on the laminated member 37. The chip-type electronic component 50 has terminal electrodes 51. By joining the terminal electrodes 51 to the outer conductor films 49 with, for example, solder 52, the chip-type electronic component 50 is surface-mounted on the laminated member 37. An electronic component may be mounted on the laminated member 37 by connection via bump electrodes or by connection with wire bonding or other suitable connection method.

The laminated ceramic electronic component 31 is mounted on a wiring board 53, which is shown by an imaginary line, so as to constitute a desired electronic device. When the laminated ceramic electronic component 31 on the wiring board 53, electric connection is established via the outer conductor films 49.

The laminated ceramic electronic component 31 of this preferred embodiment is characterized in that the via-hole conductors 38 to 47 have different sectional sizes. That is, the sectional size of the via-hole conductors 38, 39, 44, and 45 formed in the thickest ceramic layers 32 and 35 is largest, the sectional size of the via-hole conductors 46 and 47 formed in the ceramic layer 36 having the medium thickness is medium, and the sectional size of the via-hole conductors 40, 41, 42, and 43 formed in the thinnest ceramic layers 33 and 34 is smallest.

Figure 8:
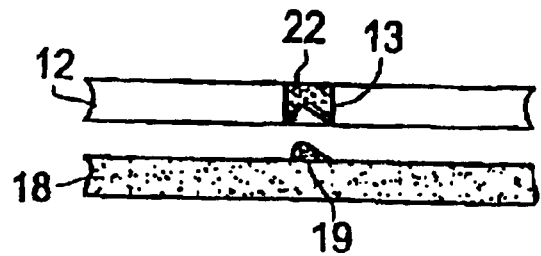
FIG. 8 is a cross-sectional view showing a state in which a part of the conductive paste in the through hole adheres to a porous sheet in order to explain a problem to be solved by preferred embodiments of the present invention.
Figure 10:
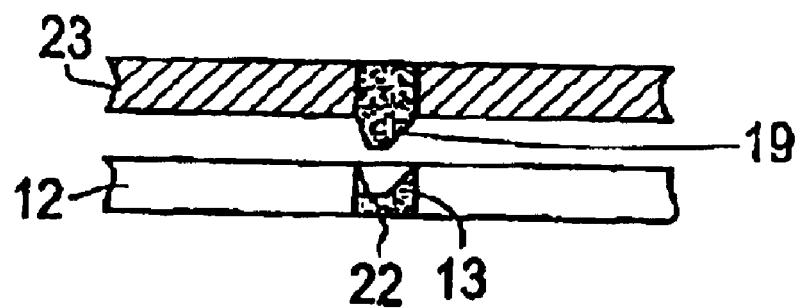
FIG. 10 is a cross-sectional view showing a state in which a part of the conductive paste in the through hole adheres to a carrier film in order to explain a problem to be solved by preferred embodiments of the present invention.

Such a relationship among the size sections is determined based on the knowledge that insufficient filling of the conductive paste 19 is more prone to occur as the sectional size of the through holes increases and the height thereof decreases, as described above with reference to FIGS. 8 and 10, and that it is advantageous to decrease the sectional size of the through holes and to increase the height in order to inhibit insufficient filling.

Figure 2:
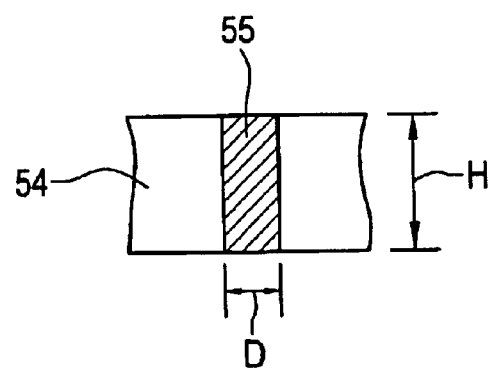
FIG. 2 is an explanatory view showing the aspect ratio H/D of a via-hole conductor.

FIG. 2 is a cross-sectional view of a via-hole conductor 55 extending through a ceramic layer 54.

Referring to FIG. 2, when it is assumed that the height of the via-hole conductor 55 is designated H and the radial length thereof is designated D, the above-described loss of conductive paste after filling can be more efficiently prevented as the aspect ratio expressed by H/D increases. However, when the aspect ratio H/D is increased by increasing the height H of the via-hole conductor 55, it becomes more difficult to fill the conductive paste into a through hole for forming the via-hole conductor 55. For this reason, it is preferable to increase the aspect ratio H/D by reducing the radial length D of the via-hole conductor 55 having a small height H. The sizes of the via-hole conductors 38 to 47 shown in FIG. 1 are designed according to this principle.

When the cross section of the above-described via-hole conductor 55 is substantially circular, the radial length D of the via-hole conductor 55 refers to the diameter of the circle. When the cross section is substantially square, the radial length D refers to the length of the sides of the square. When the cross section is substantially rectangular, the radial length D refers to the length of the long sides of the rectangle.

Since the sectional sizes of the via-hole conductors 38 to 47 shown in FIG. 1 are determined in order to prevent the conductive paste from being lost after filling and to allow easy filling of the conductive paste, a plurality of via-hole conductors extending through the same ceramic layer preferably have substantially the same sectional size. For example, the via-hole conductors 38 and 39 formed in the ceramic layer 32 preferably have substantially the same sectional size. Similarly, the via-hole conductor 40 and the via-hole conductor 41, the via-hole conductor 42 and the via-hole conductor 43, the via-hole conductor 44 and the via-hole conductor 45, and the via-hole conductor 46 and the via-hole conductor 47, preferably have substantially the same sectional size, respectively.

As the results of the examinations as to the proper range of the above-described aspect ratio H/D in consideration of prevention of loss of the conductive paste after filling and easy filling of the conductive paste, it is preferable that the aspect ratio H/D be within the range of approximately 0.1 to approximately 3.0.

For example, when it is assumed that the thickness of a ceramic layer (or a ceramic green sheet) is approximately 15 μm, the height H of a via-hole conductor formed therein is approximately 15 μm similarly, whereas a preferable radial length D of the via-hole conductor is approximately 150 μm or less. When it is assumed that the thickness of the ceramic layer (or ceramic green sheet) is approximately 10 μm, a preferable radial length D of the via-hole conductor is approximately 100 μm or less.

Conversely, when it is assumed that the radial length D of the via-hole conductor is approximately 200 μm, it is preferable that the height H of the via-hole conductor, that is, the thickness of the ceramic layer (or ceramic green sheet), be within the range of about 20 μm to about 600 μm.

Since the aspect ratio H/D has the proper range, as described above, it is unnecessary to change the radial length D of the via-hole conductor in accordance with the thickness of each of the ceramic layers, and it is practical to minimize the change of the via-hole conductor.

For example, the laminated ceramic electronic component 31 shown in FIG. 1 can be produced in the following manner.

First, ceramic green sheets are formed on a carrier film so as to define as the ceramic layers 32 to 36. The ceramic green sheets have the thicknesses corresponding to the thicknesses of the ceramic layers 32 to 36. Next, through holes are formed in each of the ceramic green sheets with a drill, a punch, a laser, or other suitable tool. The through holes are made to form the via-hole conductors 38 to 47, and the sectional sizes thereof correspond to the sectional sizes of the via-hole conductors 38 to 47.

Figure 7:
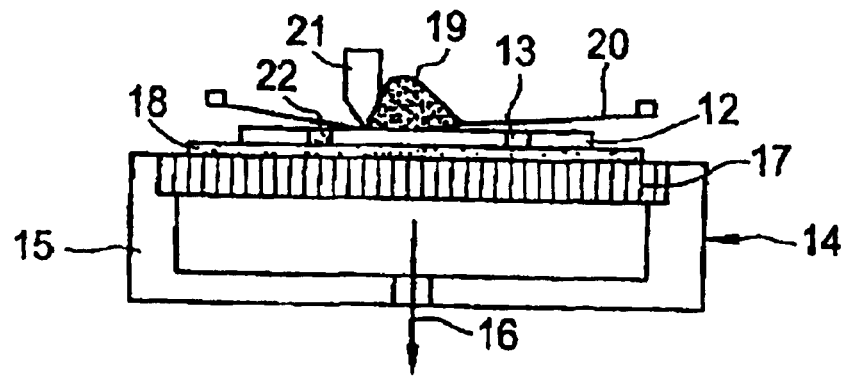
FIG. 7 is a cross-sectional view illustrating an example of a step of filling a conductive paste into a through hole.

In a case in which the method shown in FIG. 7 is adopted in the next step of filling a conductive paste into the through holes, the carrier film is peeled off the ceramic green sheets before or after the above step of forming the through holes. In a case in which the method shown in FIG. 9 is adopted, the ceramic green sheets are handled while being backed with the carrier film.

Figure 9:
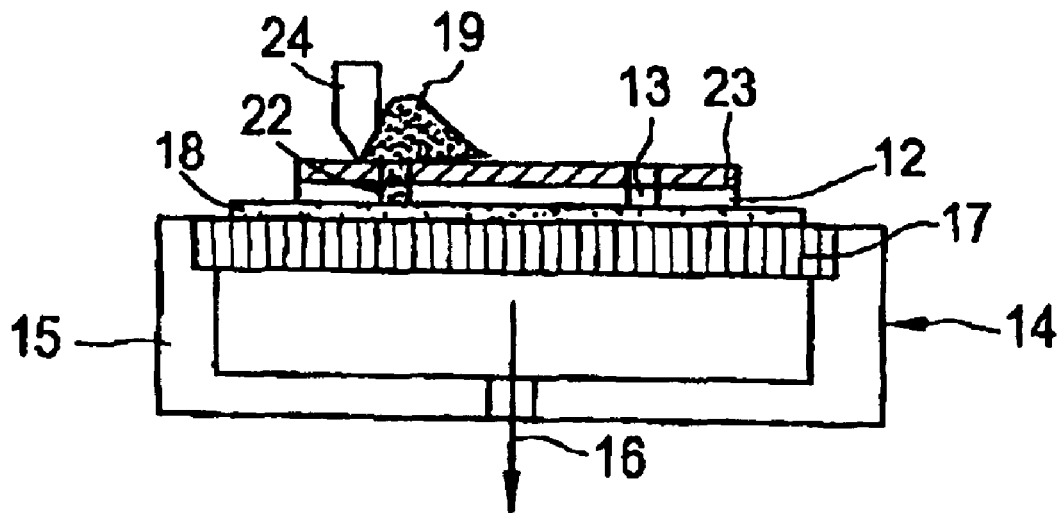
FIG. 9 is a cross-sectional view illustrating another example of a step of filling the conductive paste into the through hole.

Next, the conductive paste is filled into the through holes by the method shown in FIG. 7 or 9 and is dried. The via-hole conductors 38 to 47 are thereby formed in the through holes.

Subsequently, a conductive paste is applied onto the principal surfaces of the ceramic green sheets in a desired pattern and is dried, thereby forming conductive paste films. The conductive paste films define the inner conductor films 48 or the outer conductor films 49.

A green laminated member is then produced by stacking the ceramic green sheets described above. The green laminated member defines the laminated member 37 in the laminated ceramic electronic component 31.

In a case in which the method shown in FIG. 9 is adopted in the above-described step of filling the conductive paste into the through holes, the carrier film is peeled off the ceramic green sheets before the ceramic green sheets are stacked.

By then firing the green laminated member, the laminated member 37 is obtained for the laminated ceramic electronic component 31.

One of the outer conductor films 49 placed on the upper surface of the laminated member 37 shown in FIG. 1 and the outer conductor films 49 placed on the lower surface thereof may be formed after the green laminated member is produced or after the laminated member 37 is obtained after sintering.

After the laminated member 37 is obtained, a printed resistor, an electrical insulating film, a resist film, and other suitable elements are formed on the outer surface of the laminated member 37 and the outer conductor films 49 are subjected to plating, as necessary.

Next, the chip-type electronic component 50 is mounted on the upper surface of the laminated member 37, and the laminated ceramic electronic component 31 is thereby obtained. The laminated ceramic electronic component 31 thus obtained is mounted on the wiring board 53 so as to constitute a desired electronic device.

Figure 3:
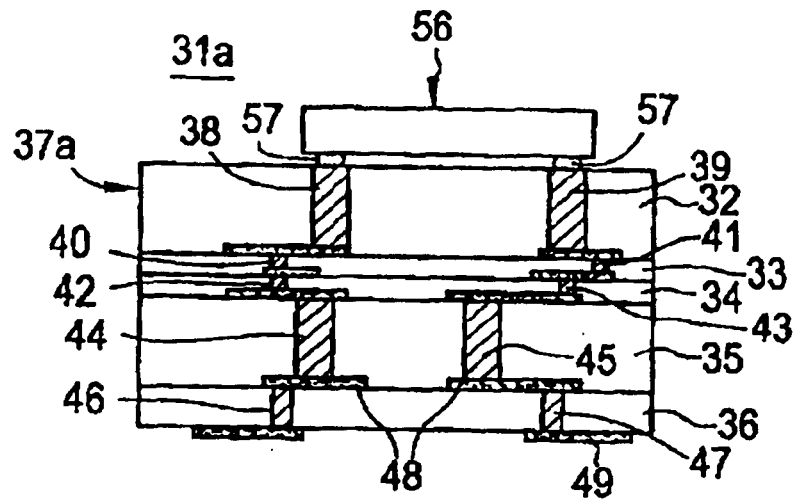
FIG. 3 is a cross-sectional view illustrating a laminated ceramic electronic component according to another preferred embodiment of the present invention.
Figure 4:
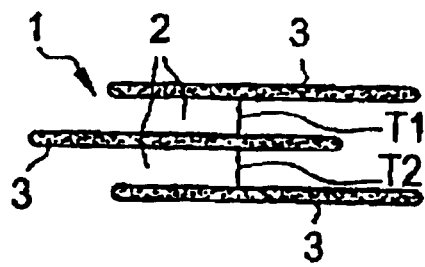
FIG. 4 is a cross-sectional view illustrating a capacitor disposed inside the laminated ceramic electronic component in order to explain the background of the present invention.
Figure 5:
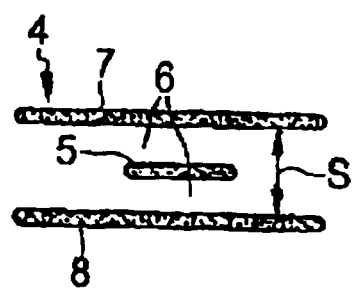
FIG. 5 is a cross-sectional view illustrating a triplate structure disposed inside the laminated ceramic electronic component in order to explain the background of the present invention.
Figure 6:
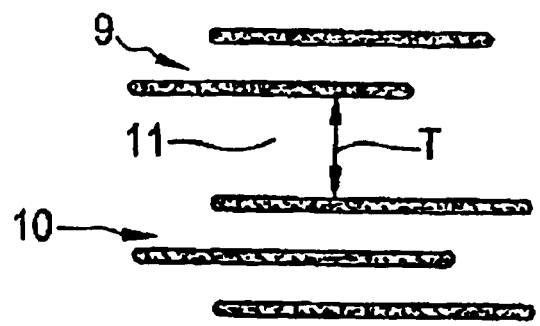
FIG. 6 is a cross-sectional view illustrating two capacitors disposed inside the laminated ceramic electronic component in order to explain the background of the present invention.

FIG. 3 is a cross-sectional view illustrating a laminated ceramic electronic component 31a according to another preferred embodiment of the present invention. In FIG. 3, components corresponding to the components shown in FIG. 1 are denoted by like numerals, and repetitive description thereof is omitted.

The laminated ceramic electronic component 31a shown in FIG. 3 includes a laminated member 37a which has a structure substantially similar to that of the laminated member 37 shown in FIG. 1 except for the following features. That is, no outer conductor films are formed on the upper surface of the laminated member 37a, and exposed end surfaces of via-hole conductors 38 and 39 are used as terminals for connection with a chip-type electronic component 56 defining a mounted component.

The chip-type electronic component 56 has bump electrodes 57. Electrical connection is established in a state in which the bump electrodes 57 are in contact with the via-hole conductors 38 and 39.

When the exposed end surfaces of the via-hole conductors 38 and 39 are used as connecting terminals, as described above, it is preferable that the sectional size of the via-hole conductors 38 and 39 be large in order to facilitate alignment of the via-hole conductors 38 and 39 and the bump electrodes 57. Since the via-hole conductors 38 and 39 formed in the thickest ceramic layer 32 have the largest sectional size in this preferred embodiment, the end surfaces thereof are suited to be used as the connecting terminals.

In place of or in addition to the chip-type electronic component 56 shown in FIG. 3, an electronic component may be surface-mounted on the laminated member 37a by soldering or other suitable process, in a manner similar to that of the chip-type electronic component 50 shown in FIG. 1, with the exposed end surfaces of the via-hole conductors 38 and 39 used as connecting terminals. Alternatively, an electronic component may be mounted on the laminated member 37 by wire bonding with the exposed end surfaces of the via-hole conductors 38 and 39 used as connecting terminals, that is, wire-bonding pads.

While the present invention has been described with reference to what are presently considered to be the preferred embodiments, it is to be understood that the invention is not limited to the disclosed preferred embodiments. On the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A laminated ceramic electronic component comprising:
   a laminated member including a plurality of stacked ceramic layers having at least two first ceramic layers and at least one second ceramic layer which is thinner than said at least two first ceramic layers; and
   wiring conductors provided for a certain layer of said ceramic layers and including a via-hole conductor extending through said certain layer and a conductor extending along the principal surface of said certain layer; wherein
   via-hole conductors of different ceramic layers have different sectional sizes; and
   the aspect ratio expressed by H/D is within the range of approximately 0.1 to approximately 3.0, wherein H and D represent the height and radial length for each of said via-hole conductors, respectively;
   a first via-hole conductor extends through each of said at least two first ceramic layers;
   a second via-hole conductor extends through said said at least one second ceramic layer; and
   the at least one second ceramic layer is disposed inside the laminated member, such that the at least one second ceramic layer is disposed between the at least two first ceramic layers.

2. A laminated ceramic electronic component according to claim 1, wherein the sectional size of said first via-hole conductor is larger than that of said second via-hole conductor.

3. A laminated ceramic electronic component according to claim 2, wherein a plurality of said via-hole conductors extending through the same ceramic layer have substantially the same sectional size.

4. A laminated ceramic electronic component according to claim 1, wherein said plurality of ceramic layers have substantially the same dielectric constant.

5. An electronic device according to claim 1, wherein a capacitor is provided on the laminated member.

6. An electronic device comprising:
   a laminated ceramic electronic component; and
   a wiring board for mounting said laminated ceramic electronic component thereon;
   wherein said laminated ceramic electronic component includes a laminated member having a plurality of stacked ceramic layers including at least two first ceramic layers and at least one second ceramic layer that is thinner than said at least two first ceramic layers;
   wherein wiring conductors are provided for a specific ceramic layer and include a via-hole conductor extending through said specific ceramic layer and a conductor film extending along the principal surface of said specific ceramic layer;
   via-hole conductors of different ceramic layers have different sectional sizes; and
   the aspect ratio expressed by H/D is within the range of approximately 0.1 to approximately 3.0, wherein H and D represent the height and radial length for each of said via-hole conductors, respectively;
   a first via-hole conductor extends through each of said at least two first ceramic layers;
   a second via-hole conductor extends through each of said at least one second ceramic layer; and
   the at least one second ceramic layer is disposed inside the laminated member, such that the at least one second ceramic layer is disposed between the at least two first ceramic layers.

7. An electronic device according to claim 6, wherein the sectional size of said first via-hole conductor is larger than that of said second via-hole conductor.

8. An electronic device according to claim 7, wherein a plurality of said via-hole conductors extending through the same ceramic layer have substantially the same sectional size.

9. An electronic device according to claim 7, wherein said plurality of ceramic layers have substantially the same dielectric constant.

10. An electronic device according to claim 6, wherein a capacitor is provided on the laminated member.

* * * * *